(12) United States Patent
Lee et al.

(10) Patent No.: US 12,727,237 B2
(45) Date of Patent: Sep. 1, 2026

(54) SEMICONDUCTOR DEVICE AND METHOD FOR FABRICATING THE SAME

(71) Applicant: UNITED MICROELECTRONICS CORP., Hsin-Chu City (TW)

(72) Inventors: Kuo-Hsing Lee, Hsinchu County (TW); Chun-Hsien Lin, Tainan City (TW); Yung-Chen Chiu, Taichung City (TW); Sheng-Yuan Hsueh, Tainan City (TW); Chi-Horn Pai, Tainan City (TW)

(73) Assignee: UNITED MICROELECTRONICS CORP., Hsin-Chu City (TW)

( * ) Notice: Subject to any disclaimer, the term of this patent is extended or adjusted under 35 U.S.C. 154(b) by 448 days.

(21) Appl. No.: 17/844,088

(22) Filed: Jun. 20, 2022

(65) Prior Publication Data

US 2023/0378166 A1 Nov. 23, 2023

(30) Foreign Application Priority Data

May 19, 2022 (CN) ........................ 202210553739.X

(51) Int. Cl.
*H10D 84/80* (2025.01)
*H10D 1/47* (2025.01)
*H10D 30/01* (2025.01)
*H10D 30/62* (2025.01)

(52) U.S. Cl.
CPC ............. *H10D 84/811* (2025.01); *H10D 1/47* (2025.01); *H10D 30/024* (2025.01); *H10D 30/6211* (2025.01)

(58) Field of Classification Search
CPC . H01L 27/0629; H01L 27/0886; H01L 28/20; H01L 28/24; H01L 29/66795; H01L 29/7851; H01L 29/7816; H01L 29/66681; H01L 23/481; H10D 1/47; H10D 1/474; H10D 30/024; H10D 30/6211; H10D 84/0128; H10D 84/0142; H10D 84/0144; H10D 84/0158; H10D 84/038; H10D 84/811; H10D 84/834
See application file for complete search history.

(56) References Cited

U.S. PATENT DOCUMENTS

| | | | | |
|---|---|---|---|---|
| 8,860,181 | B2 | 10/2014 | Wei | |
| 10,937,830 | B2 | 3/2021 | Huang | |
| 2009/0039423 | A1* | 2/2009 | Ikeda | H01L 21/823857 257/334 |
| 2013/0277754 | A1 | 10/2013 | Liang | |
| 2016/0020148 | A1* | 1/2016 | Song | H01L 23/5228 438/238 |
| 2018/0130796 | A1* | 5/2018 | Jun | H10D 84/811 |
| 2018/0151376 | A1* | 5/2018 | Choi | H01L 21/31053 |
| 2018/0190754 | A1* | 7/2018 | Lin | H01L 27/0629 |

(Continued)

FOREIGN PATENT DOCUMENTS

CN 1866525 A 11/2006

*Primary Examiner* — Shaun M Campbell
(74) *Attorney, Agent, or Firm* — Winston Hsu

(57) ABSTRACT

A method for fabricating a semiconductor device includes the steps of first providing a substrate having a resistor region, forming a first gate structure on the resistor region, forming a first interlayer dielectric (ILD) layer around the first gate structure, transforming the first gate structure into a first metal gate having a gate electrode on the substrate and a hard mask on the gate electrode, and then forming a resistor on the first metal gate.

18 Claims, 9 Drawing Sheets

(56) References Cited

U.S. PATENT DOCUMENTS

| | | | | |
|---|---|---|---|---|
| 2018/0211952 | A1* | 7/2018 | Shin | H01L 23/5228 |
| 2020/0266237 | A1* | 8/2020 | Huang | H10B 63/00 |
| 2023/0326634 | A1* | 10/2023 | Wang | H01L 23/5283 438/360 |

* cited by examiner

SEMICONDUCTOR DEVICE AND METHOD FOR FABRICATING THE SAME

BACKGROUND OF THE INVENTION

1. Field of the Invention

The invention relates to a method of fabricating semiconductor device, and more particularly to a method of integrating high-voltage (HV) device, medium-voltage (MV) device, and low-voltage (LV) device.

2. Description of the Prior Art

In current semiconductor processing, controllers, memories, circuits of low-voltage operation and power devices of high-voltage operation are largely integrated into a single chip to achieve a single-chip system. The power device, such as vertical double-diffusion metal-oxide-semiconductor (VDMOS), insulated gate bipolar transistor (IGBT) and lateral diffusion MOS (LDMOS), is employed to increase power switching efficiency and decrease the loss of energy resources. It is often required that the switching transistors withstand high breakdown voltages and operate at a low on-resistance.

Moreover with the trend in the industry being towards scaling down the size of the metal oxide semiconductor transistors (MOS), three-dimensional or non-planar transistor technology, such as fin field effect transistor technology (FinFET) has been developed to replace planar MOS transistors. Since the three-dimensional structure of a FinFET increases the overlapping area between the gate and the fin-shaped structure of the silicon substrate, the channel region can therefore be more effectively controlled. This way, the drain-induced barrier lowering (DIBL) effect and the short channel effect are reduced. The channel region is also longer for an equivalent gate length, thus the current between the source and the drain is increased. In addition, the threshold voltage of the fin FET can be controlled by adjusting the work function of the gate.

However as the scale of current devices continue to decrease the integration of high-voltage devices and FinFET devices start to face numerous challenges such as current leakage and control of breakdown voltage. Hence, how to improve the current fabrication for improving performance of the device has become an important task in this field.

SUMMARY OF THE INVENTION

According to an embodiment of the present invention, a method for fabricating a semiconductor device includes the steps of first providing a substrate having a resistor region, forming a first gate structure on the resistor region, forming a first interlayer dielectric (ILD) layer around the first gate structure, transforming the first gate structure into a first metal gate having a gate electrode on the substrate and a hard mask on the gate electrode, and then forming a resistor on the first metal gate.

According to another aspect of the present invention, a semiconductor device includes a substrate having a resistor region, a first gate structure on the resistor region, a first interlayer dielectric (ILD) layer around the first gate structure, and a resistor directly on the first gate structure. Preferably, the first gate structure includes a gate electrode on the substrate and a hard mask on the gate electrode.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
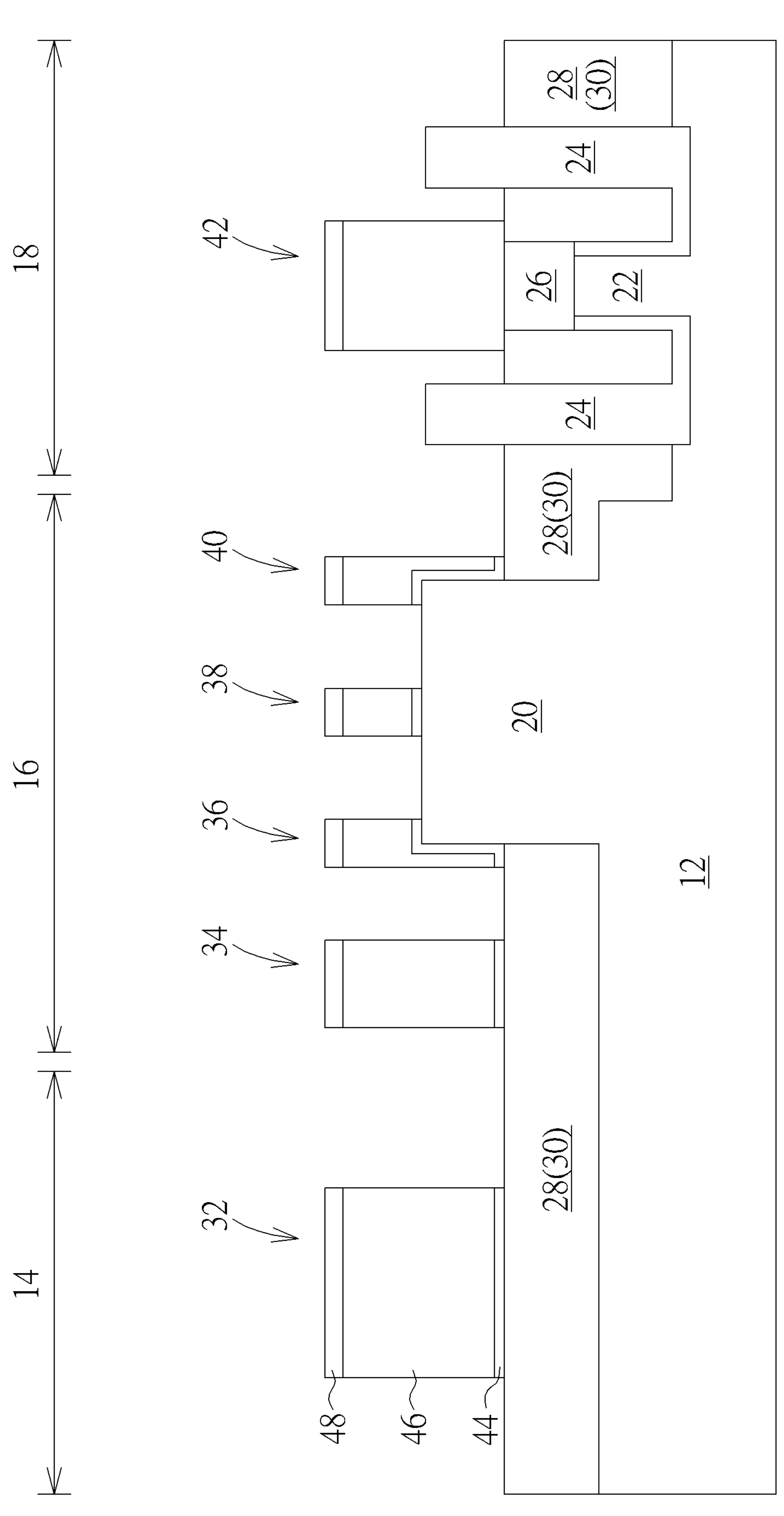
FIGS. 1-6 illustrate a method for fabricating a semiconductor device according to an embodiment of the present invention.

Referring to FIGS. 1-6, FIGS. 1-6 illustrate a method for fabricating a semiconductor device according to an embodiment of the present invention. As shown in FIG. 1, a substrate 12, such as a silicon substrate or silicon-on-insulator (SOI) substrate is provided and three or more transistor regions such as a resistor region 14, a low-voltage (LV) region 16, and a high voltage (HV) region 18 are defined on the substrate 12, in which the resistor region 14 is defined for fabricating high-voltage resistors, the LV region 16 is defined for fabricating fin field-effect transistors (FinFETs), and the HV region 18 is defined for fabricating HV devices. In this embodiment, the resistor region 14, the LV region 16, and the HV region 18 could be transistor regions having same conductive type or different conductive types. For instance, each of the three regions 14, 16, 18 could be a PMOS region and/or a NMOS region.

Next, one or more fin-shaped structures 20 are formed on the substrate 12 of the LV region 16 and a base 22 is are formed on the HV region 18. Preferably, the fin-shaped structures 20 and the base 22 could be obtained by a sidewall image transfer (SIT) process. For instance, a layout pattern is first input into a computer system and is modified through suitable calculation. The modified layout is then defined in a mask and further transferred to a layer of sacrificial layer on a substrate through a photolithographic and an etching process. In this way, several sacrificial layers distributed with a same spacing and of a same width are formed on a substrate. Each of the sacrificial layers may be stripe-shaped. Subsequently, a deposition process and an etching process are carried out such that spacers are formed on the sidewalls of the patterned sacrificial layers. In a next step, sacrificial layers can be removed completely by performing an etching process. Through the etching process, the pattern defined by the spacers can be transferred into the substrate underneath, and through additional fin cut processes, desirable pattern structures, such as stripe patterned fin-shaped structures could be obtained.

Alternatively, the fin-shaped structures 20 and the base 22 could also be obtained by first forming a patterned mask (not shown) on the substrate, 12, and through an etching process, the pattern of the patterned mask is transferred to the substrate 12 to form the fin-shaped structures 20 and the base 22. Moreover, the formation of the fin-shaped structures 20 and the base 22 could also be accomplished by first forming a patterned hard mask (not shown) on the substrate 12, and a semiconductor layer composed of silicon germanium is grown from the substrate 12 through exposed patterned hard mask via selective epitaxial growth process to form the corresponding the fin-shaped structures 20 and the base 22.

These approaches for forming the fin-shaped structures 20 and the base 22 are all within the scope of the present invention.

Next, flowable chemical vapor deposition (FCVD) process is conducted to form an insulating layer 28 made of silicon oxide on the fin-shaped structures 20 and the base 22 and filling the trenches between the fin-shaped structures 20 and the base 22, and a planarizing process such as chemical mechanical polishing (CMP) process is conducted to remove part of the insulating layer 28 so that the top surface of the fin-shaped structures 20 is even with the top surface of the insulating layer 28.

Next, an ion implantation process is conducted to form a doped region 24 adjacent to two sides of the base 22 on the HV region 18, in which the doped region 24 preferably serves a lightly doped drain (LDD) for the HV device formed afterwards. Next, an etching process is conducted by using a patterned mask (not shown) as mask to remove part of the base 22 on the HV region 18 for forming a recess (not shown), an oxide growth process or more specifically a rapid thermal oxidation (RTO) process is conducted to form a gate dielectric layer 26 made of silicon oxide on the base 22 on the HV region 18, and the patterned mask is completely removed thereafter. Next, an etching back process is conducted to remove part of the insulating layer 28 on the resistor region 14, the LV region 16, and the HV region 18 so that the top surface of the remaining insulating layer 28 is slightly lower than the top surface of the fin-shaped structures 20 on the LV region 16 and the top surface of the base 22 on the HV region 18 for forming a shallow trench isolation (STI) 30.

Next, gate structures 32, 34, 36, 38, 40, 42 or dummy gates are formed on the fin-shaped structures 20 and base 22 of the resistor region 14, the LV region 16, and the HV region 18. In this embodiment, the formation of the gate structures 32, 34, 36, 38, 40, 42 could be accomplished by a gate first process, a high-k first approach from gate last process, or a high-k last approach from gate last process.

Since this embodiment pertains to a high-k last approach, a gate dielectric layer 44 made of silicon oxide, a gate material layer 46 made of polysilicon, and a hard mask 48 made of silicon nitride (SiN) could be formed sequentially on the STI 30, the fin-shaped structures 20, and the base 22, and a pattern transfer process is then conducted by using a patterned resist (not shown) as mask to remove part of the hard mask 48, part of the gate material layer 46, and part of the gate dielectric layer 44 through single or multiple etching processes. After stripping the patterned resist, gate structures 32, 34, 36, 38, 40, 42 each composed of a gate dielectric layer 44, a patterned gate material layers 46, and a patterned hard mask 48 are formed on the substrate 12 on each region, in which the patterned gate material layer 46 becomes a gate electrode on each region.

Figure 2:
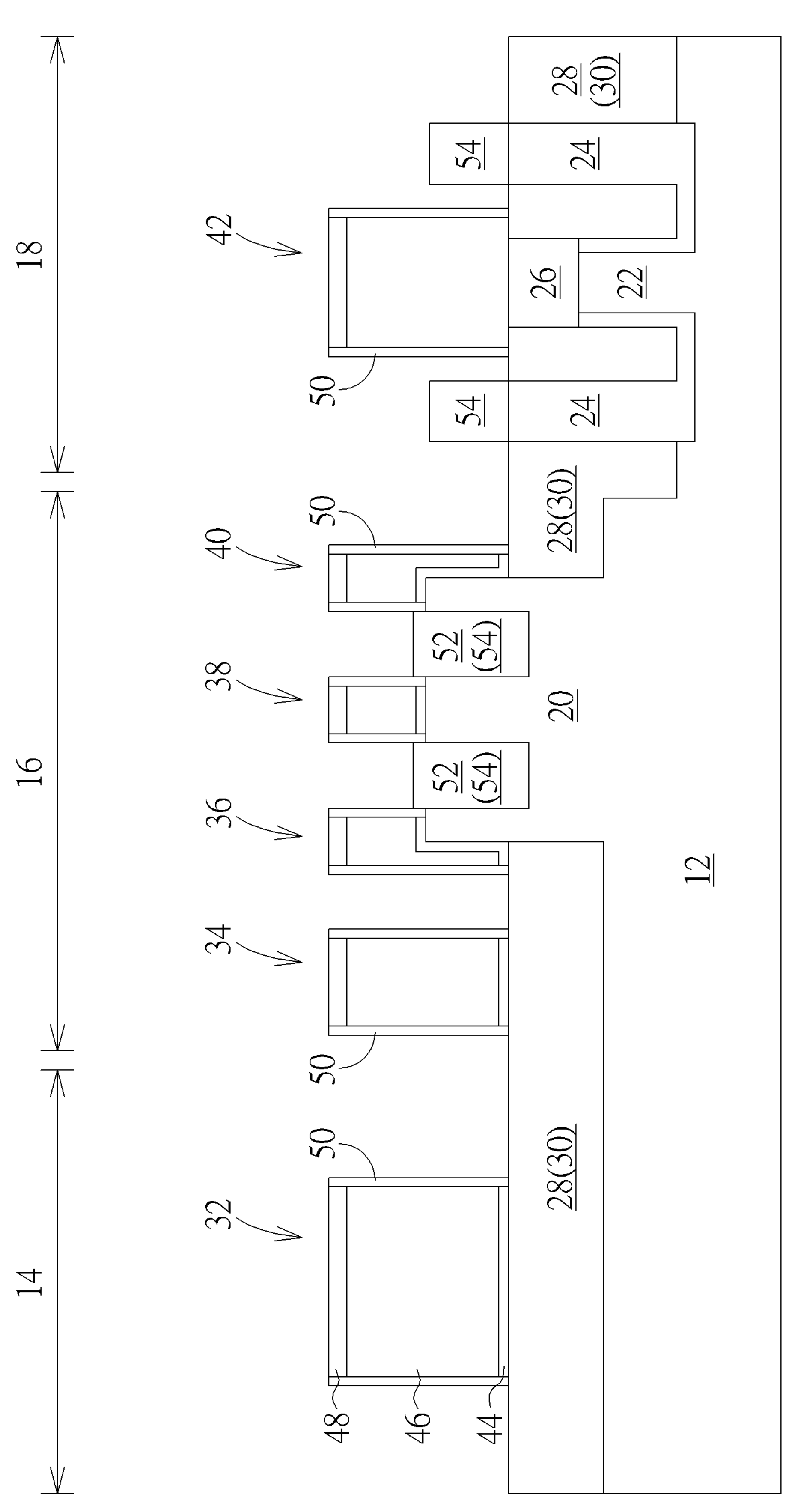

Next, as shown in FIG. 2, at least a spacer 50 is formed on sidewalls of the gate structures 32, 34, 36, 38, 40, 42. In this embodiment, the spacer could be a single spacer or a composite spacer, in which the spacer could further include an offset spacer (not shown) and a main spacer (not shown). The offset spacer and the main spacer are preferably made of different materials while the offset spacer and main spacer could all be selected from the group consisting of $SiO_2$, SiN, SiON, and SiCN, but not limited thereto.

Next, a dry etching and/or wet etching process is conducted one or multiple times along the spacers 50 on the LV region 16 to remove part of the fin-shaped structures 20 for forming recesses (not shown) adjacent to two sides of the gate structure 38. Next, a selective epitaxial growth (SEG) process is conducted to form epitaxial layers 52 in the recesses. It should be noted that the epitaxial layers 52 are only formed adjacent to two sides of the gate structure 38 on the LV region 16 while no epitaxial layers are formed on the resistor region 14 and the HV region 18.

It should be noted that even though the epitaxial layers 52 formed on the LV region 16 include rectangular shapes, the epitaxial layers 52 also share substantially same cross-section shape with the recesses. For instance, the cross-section of each of the epitaxial layers 52 could also include a circle, a hexagon, or an octagon depending on the demand of the product. In this embodiment, the epitaxial layers 52 could also be formed to include different materials depending on the type of transistor being fabricated. For instance, if the MOS transistor being fabricated were to be a PMOS transistor, the epitaxial layers 52 could be made of material including but not limited to for example SiGe, SiGeB, or SiGeSn. If the MOS transistor being fabricated were to be a NMOS transistor, the epitaxial layers 52 could be made of material including but not limited to for example SiC, SiCP, or SiP. Moreover, the SEG process could also be adjusted to form a single-layered epitaxial structure or multi-layered epitaxial structure, in which heteroatom such as germanium atom or carbon atom of the structure could be formed to have gradient while the surface of the epitaxial layers 52 is preferred to have less or no germanium atom at all to facilitate the formation of silicide afterwards.

Next, one or more ion implantation process is conducted to form source/drain regions 54 in the base 22 adjacent to two sides of the gate structure 42 on the HV region 18. According to an embodiment of the present invention, it would also be desirable to form source/drain regions 54 in part or all of the epitaxial layers 52 on the LV region 16. According to another embodiment of the present invention, the source/drain regions 54 could also be formed insituly during the SEG process. For instance, the source/drain regions 54 could be formed by implanting p-type dopants during formation of a SiGe epitaxial layer, a SiGeB epitaxial layer, or a SiGeSn epitaxial layer for PMOS transistor, or could be formed by implanting n-type dopants during formation of a SiC epitaxial layer, SiCP epitaxial layer, or SiP epitaxial layer for NMOS transistor. By doing so, it would be desirable to eliminate the need for conducting an extra ion implantation process for forming the source/drain regions 54. Moreover, the dopants within the source/drain regions 54 could also be formed with a gradient, which is also within the scope of the present invention.

Figure 3:
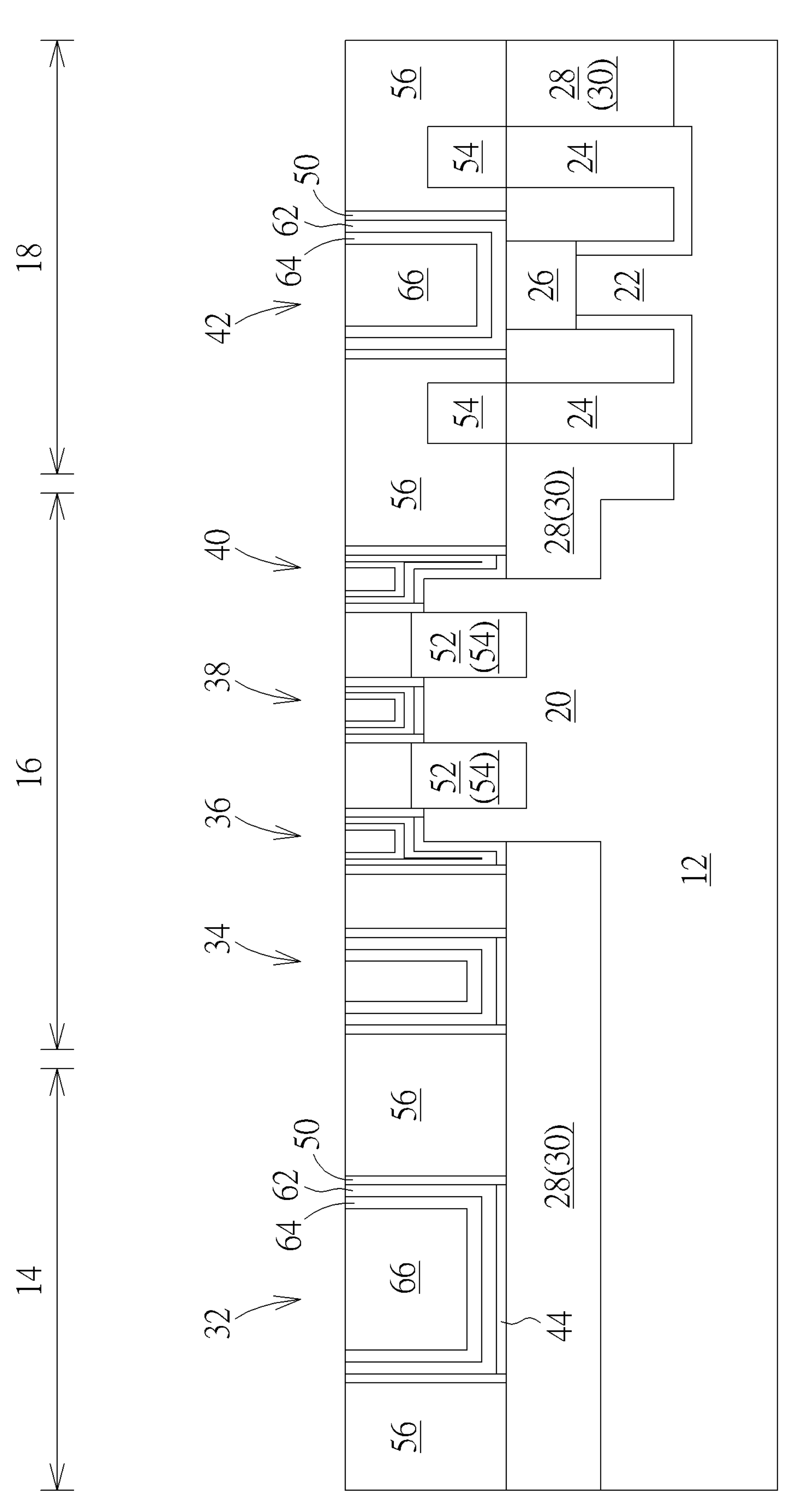

Next, as shown in FIG. 3, a selective contact etch stop layer (CESL) (not shown) could be formed on the substrate 12 surface to cover the gate structures 32, 34, 36, 38, 40, 42 on the resistor region 14, the LV region 16, and the HV region 18, and an interlayer dielectric (ILD) layer 56 is formed on the CESL afterwards. Next, a planarizing process such as a chemical mechanical polishing (CMP) process is conducted to remove part of the ILD layer 56 and part of the CESL so that the top surfaces of the hard mask 48 and ILD layer 56 are coplanar.

Next, a replacement metal gate (RMG) process is conducted to transform the gate structures 32, 34, 36, 38, 40, 42 on the resistor region 14, the LV region 16, and the HV region 18 into metal gates. For instance, the RMG process could be accomplished by first performing a selective dry etching or wet etching process using etchants including but not limited to for example ammonium hydroxide ($NH_4OH$) or tetramethylammonium hydroxide (TMAH) to remove the hard masks 48 and the gate material layers 46 from gate structures 32, 34, 36, 38, 40, 42 for forming recesses (not shown) in the ILD layer 56. Next, a high-k dielectric layer 62, a work function metal layer 64, and a low resistance metal layer 66 are formed in the recesses, and a planarizing process such as CMP is conducted to remove part of low resistance metal layer 66, part of work function metal layer 64, and part of high-k dielectric layer 62 to form metal gates. Preferably, the high-k dielectric layer 62, the work function metal layer 64, and the low resistance metal layer 66 altogether constitute the gate electrode for each of the transistors or devices.

In this embodiment, the high-k dielectric layer 62 is preferably selected from dielectric materials having dielectric constant (k value) larger than 4. For instance, the high-k dielectric layer 62 may be selected from hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanate oxide ($SrTiO_3$), zirconium silicon oxide ($ZrSiO_4$), hafnium zirconium oxide ($HfZrO_4$), strontium bismuth tantalate ($SrBi_2Ta_2O_9$, SBT), lead zirconate titanate ($PbZr_xTi_{1-x}O_3$, PZT), barium strontium titanate ($Ba_xSr_{1-x}TiO_3$, BST) or a combination thereof.

In this embodiment, the work function metal layer 64 is formed for tuning the work function of the metal gate in accordance with the conductivity of the device. For an NMOS transistor, the work function metal layer 64 having a work function ranging between 3.9 eV and 4.3 eV may include titanium aluminide (TiAl), zirconium aluminide (ZrAl), tungsten aluminide (WAl), tantalum aluminide (TaAl), hafnium aluminide (HfAl), or titanium aluminum carbide (TiAlC), but it is not limited thereto. For a PMOS transistor, the work function metal layer 64 having a work function ranging between 4.8 eV and 5.2 eV may include titanium nitride (TiN), tantalum nitride (TaN), tantalum carbide (TaC), but it is not limited thereto. An optional barrier layer (not shown) could be formed between the work function metal layer 64 and the low resistance metal layer 66 may include titanium (Ti), titanium nitride (TiN), tantalum (Ta) or tantalum nitride (TaN). Furthermore, the material of the low-resistance metal layer 66 may include copper (Cu), aluminum (Al), titanium aluminum (TiAl), cobalt tungsten phosphide (CoWP) or any combination thereof. Since the transformation of dummy gates into metal gates through RMG process is well known to those skilled in the art, the details of which are not explained herein for the sake of brevity.

Figure 4:
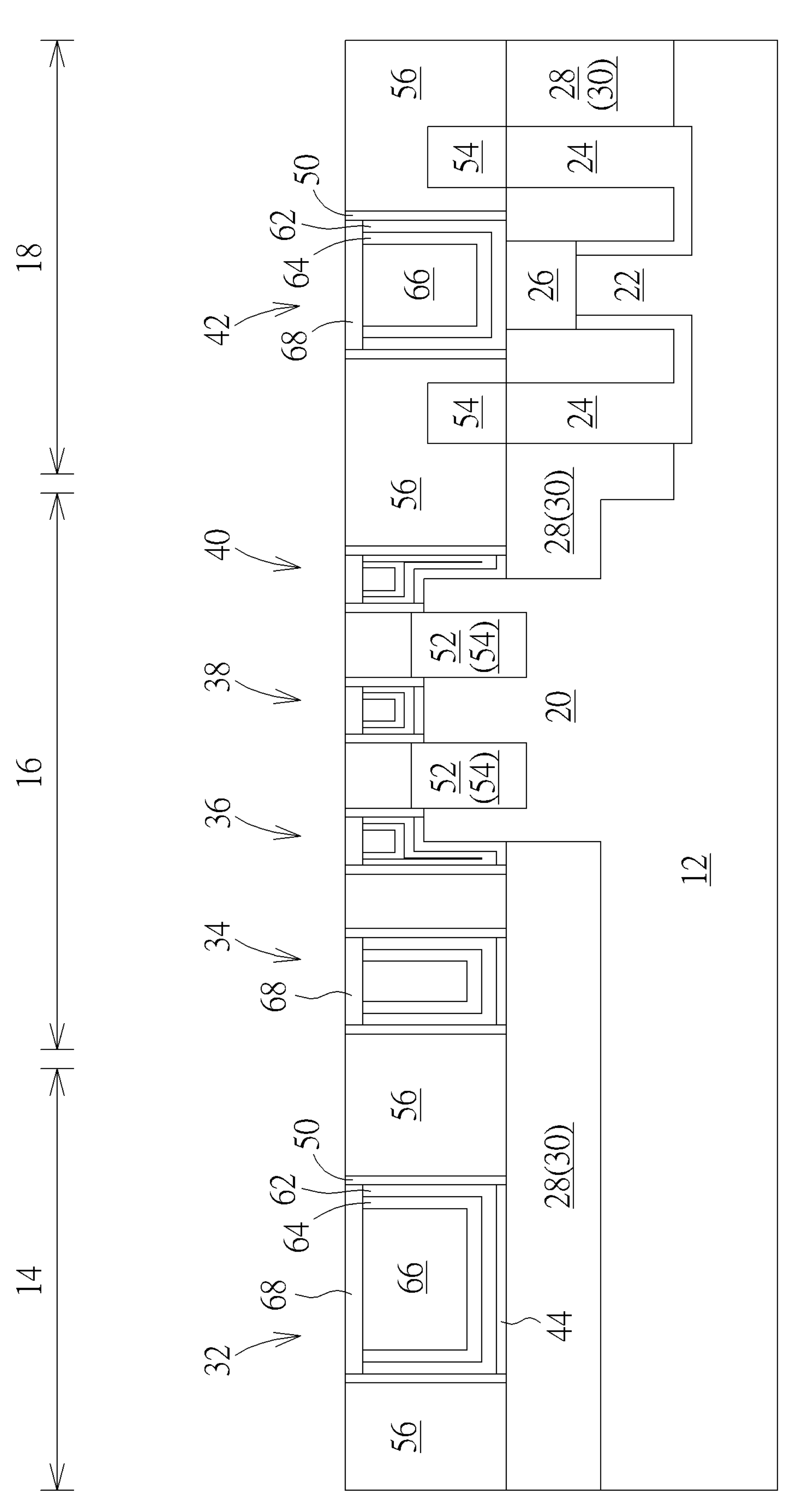

Next, as shown in FIG. 4, part of the high-k dielectric layer 62, part of the work function metal layer 64, and part of the low resistance metal layer 66 are removed to form recesses (not shown), and a hard mask 68 is formed into each of the recesses so that the top surfaces of the hard masks 68 and the ILD layer 56 are coplanar. Preferably the hard masks 68 are made of SiN, but could also include $SiO_2$, SiON, SiCN, or combination thereof.

Figure 5:
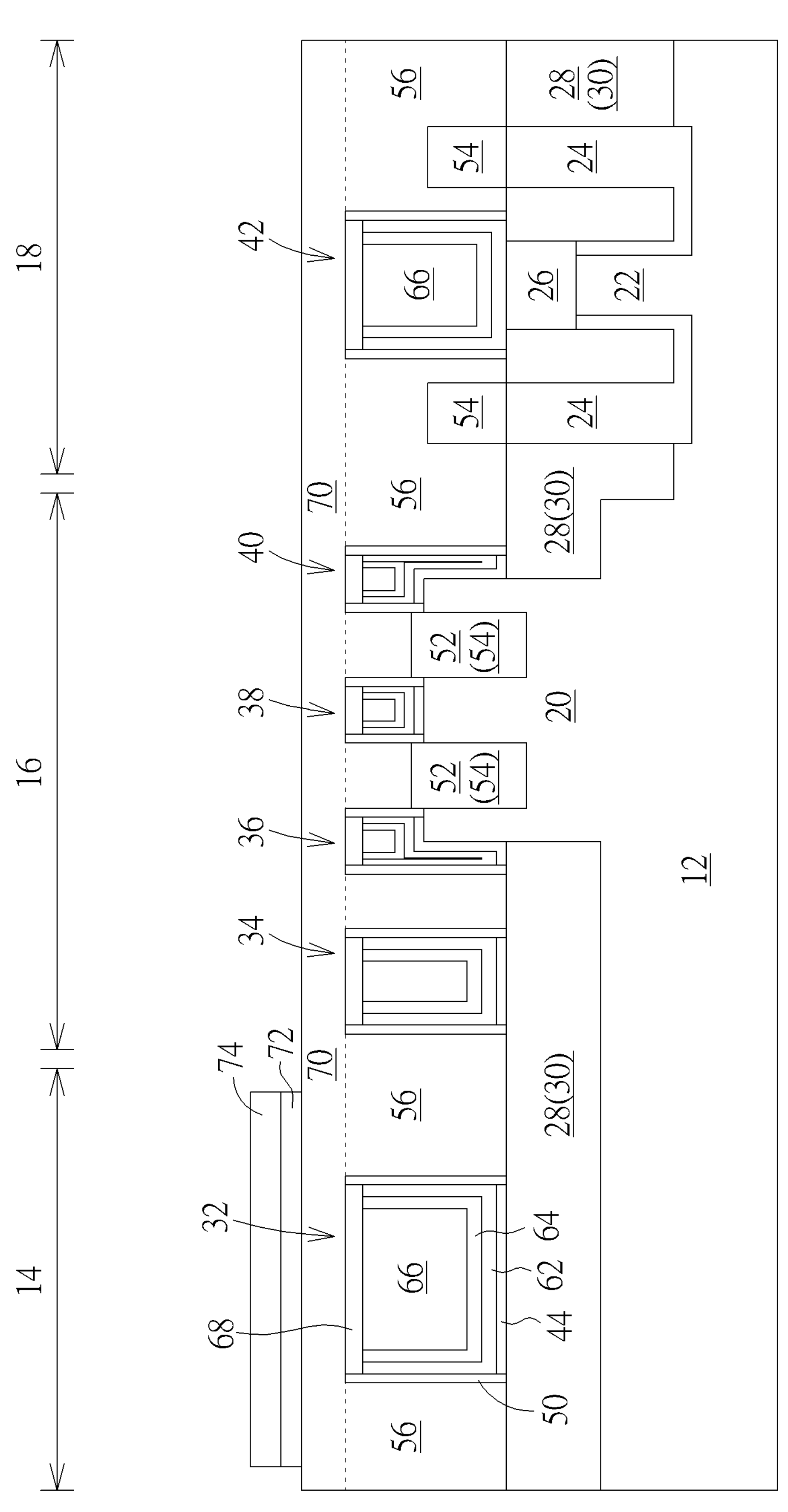

Next, as shown in FIG. 5, another ILD layer 70 is formed on the gate structures 32, 34, 36, 38, 40, 42 and the ILD layer 56, a metal layer 72 is formed on the surface of the ILD layer 70, and a cap layer 74 is formed on the metal layer 72 thereafter. Next, a photo-etching process is conducted to remove part of the cap layer 74 and part of the metal layer 72 outside the resistor region 14 so that the sidewalls of the patterned metal layer 72 and cap layer 74 are aligned to form a resistor. In this embodiment, the metal layer 72 is preferably made of metal nitride such as TiN while the cap layer 74 is made of dielectric material such as SiN, the thickness of the metal layer 72 is between 40-60 Angstroms or most preferably 50 Angstroms, and the thickness of the cap layer 74 is between 90-110 Angstroms or most preferably 100 Angstroms.

Figure 6:
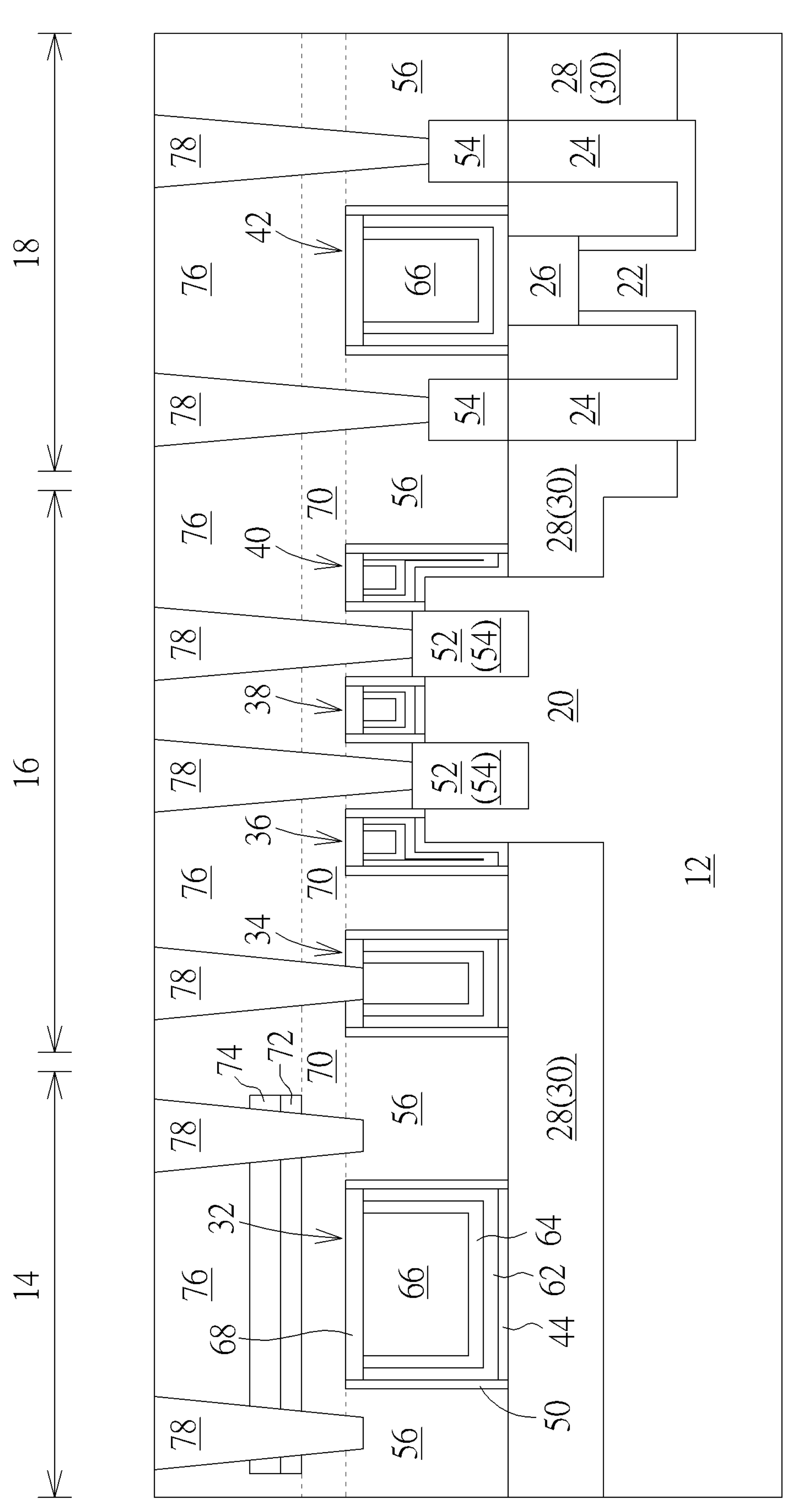

Next, as shown in FIG. 6, another ILD layer 76 is formed on the ILD layer 70, and a photo-etching process is conducted by using a patterned mask (not shown) as mask to remove part of the ILD layers 56, 70, 76 adjacent to the gate structures 32, 34, 36, 38, 40, 42 including part of the ILD layer 76, part of the cap layer 74, part of the metal layer 72, part of the ILD layer 70, and part of the ILD layer 56 on the resistor region 14, part of the ILD layers 56, 70, 76 on the LV region 16, and part of the ILD layers 56, 70, 76 on the HV region 18 for forming contact holes (not shown) exposing the source/drain regions 54 on the LV region 16 and HV region 18. Next, conductive materials including a barrier layer selected from the group consisting of titanium (Ti), titanium nitride (TiN), tantalum (Ta), and tantalum nitride (TaN) and a metal layer selected from the group consisting of tungsten (W), copper (Cu), aluminum (Al), titanium aluminide (TiAl), and cobalt tungsten phosphide (CoWP) are deposited into the contact holes, and a planarizing process such as CHIP is conducted to remove part of aforementioned barrier layer and metal layer for forming contact plugs 78 electrically connecting the source/drain regions 54 and/or gate structure 34. Preferably, the ILD layers 56, 70, 76 could be made of same or different materials including but not limited to for example silicon oxide or low-k dielectric layer. This completes the fabrication of a semiconductor device according to an embodiment of the present invention.

Referring again to FIG. 6, FIG. 6 further illustrates a structural view of a semiconductor device according to an embodiment of the present invention. As shown in FIG. 6, the semiconductor device includes a resistor disposed on the resistor region 14, at least a FinFET disposed on the LV region 16, and a HV device disposed on the HV region 18, in which gate structures 32, 34, 36, 38, 40, 42 are disposed on the resistor region 14, the LV region 16, and the HV region 18 respectively and the top surface of the gate structures 32, 34, 36, 38, 40, 42 such as the top surface of the hard masks 68 are coplanar.

Viewing from a more details perspective, the resistor on the resistor region 14 includes a metal layer 72 disposed on the surface of the ILD layer 70 and a cap layer 74 disposed on the metal layer 72, in which at least a sidewall of the metal layer 72 is aligned with a sidewall of the cap layer 74, the metal layer 72 is preferably made of metal nitride such as TiN while the cap layer 74 is made of dielectric material such as SiN, the thickness of the metal layer 72 is between 40-60 Angstroms or most preferably 50 Angstroms, and the thickness of the cap layer 74 is between 90-110 Angstroms or most preferably 100 Angstroms.

A gate structure 32 such as a dummy gate is disposed directly under the metal layer 72 of the resistor and standing on top of the STI 30, an ILD layer 70 is disposed between the metal layer 72 and the gate structure 32 so that the two elements 32, 72 not contacting each other directly, a distance between the bottom surface of the metal layer 72 to a top surface of the gate structure 32 could be two times, three times, four times, or even five times the overall thickness of the metal layer 72, the metal layer 72 and the cap layer 74 could share same widths, the width of the metal layer 72 is greater than the width of the gate structure 32, and the width of the metal layer 72 could be greater than two times and smaller than three times the width of the gate structure 32.

Preferably, contact plugs 78 on the resistor region 14 are disposed on the resistor region 14 to penetrate through the cap layer 74 and metal layer 72 and embedded in the ILD layers 70 and 56, the contact plugs 78 are disposed adjacent to two sides of the gate structure 32 not contacting each other directly, and a distance between a sidewall of the gate structure 32 to a sidewall of the contact plug 78 is between 20-40 nm or most preferably 30 nm.

Even though the bottom surface of the contact plugs 78 is slightly lower than the top surface of the gate structure 32 including the top surface of the hard mask 68 but even with the top surface of the gate electrode including the U-shape high-k dielectric layer 62, the U-shape work function metal layer 64, and the low resistance metal layer 66, according to other embodiment of the present invention, the bottom surface of the contact plugs 78 also be even with or higher than the top surface of the gate structure 32 while still penetrating through the cap layer 74 and the metal layer 72 and embedded in the ILD layer 70. Moreover, the top surface of the contact plugs 78 on the resistor region 14 is even with the contact plugs 78 on the LV region 16 and HV region 18 and the bottom surface of the contact plugs 78 could be even with the contact plug 78 directly contacting the gate structure 34 but higher than the bottom surface of the other contact plugs 78.

Figure 7:
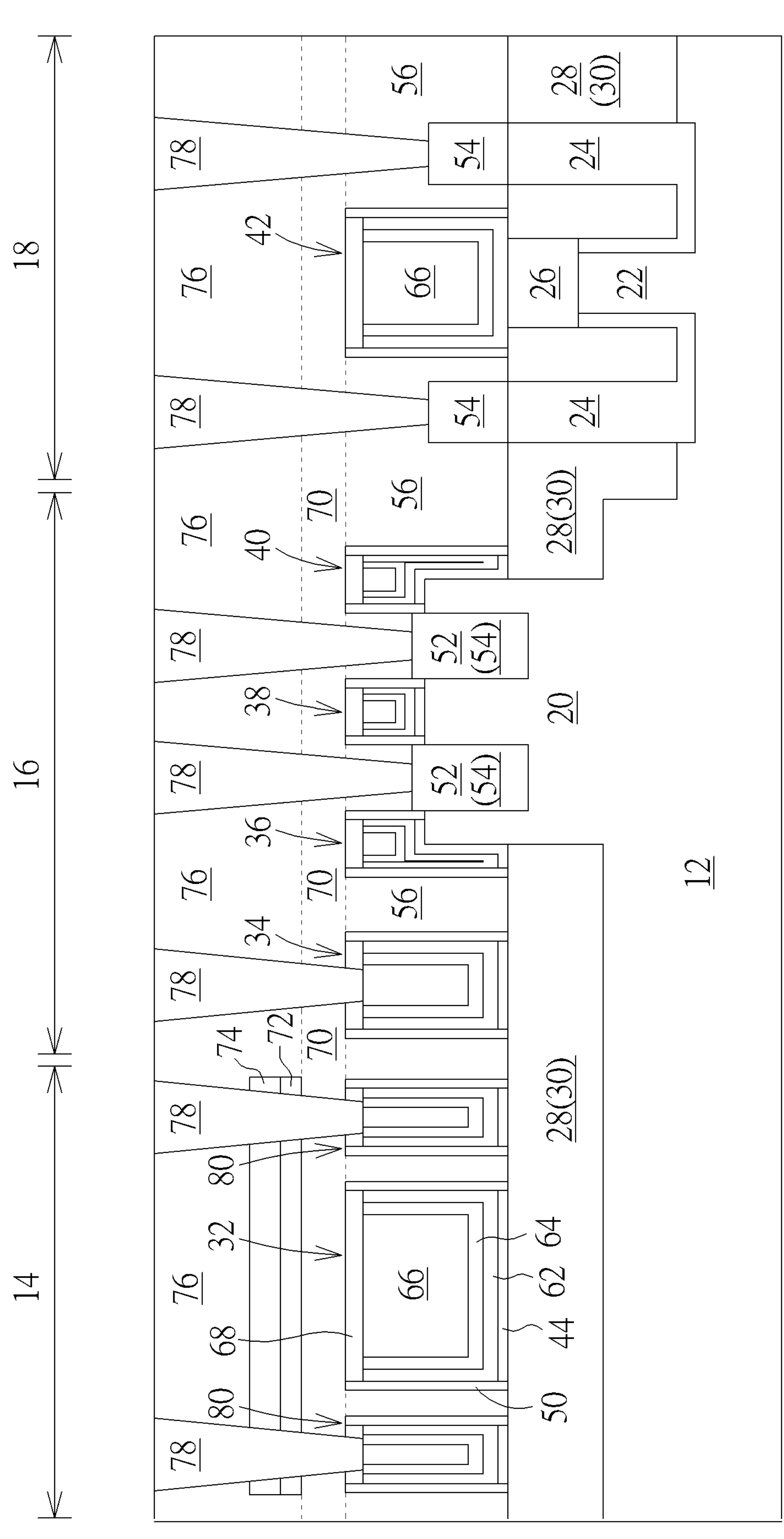
FIG. 7 illustrates a structural view of a semiconductor device according to an embodiment of the present invention.

Referring to FIG. 7, FIG. 7 further illustrates a structural view of a semiconductor device according to an embodiment of the present invention. As shown in FIG. 7, in contrast to the aforementioned embodiment of disposing a gate structure 32 directly under the metal layer 72 while no gate structure is disposed directly under the two contact plugs 78 penetrating metal layer 72, it would also be desirable to form additional gate structures 80 directly under the two contact plugs 78 on the STI 38 as the gate structures 80 contact the contact plugs 78 directly. Since the gate structures 80 and the gate structures 32, 34, 36, 38, 40, 42 are formed through the same process, the top surface of the gate structure 80 is even with the top surface of the gate structures 32, 34, 36, 38, 40, 42.

Figure 8:
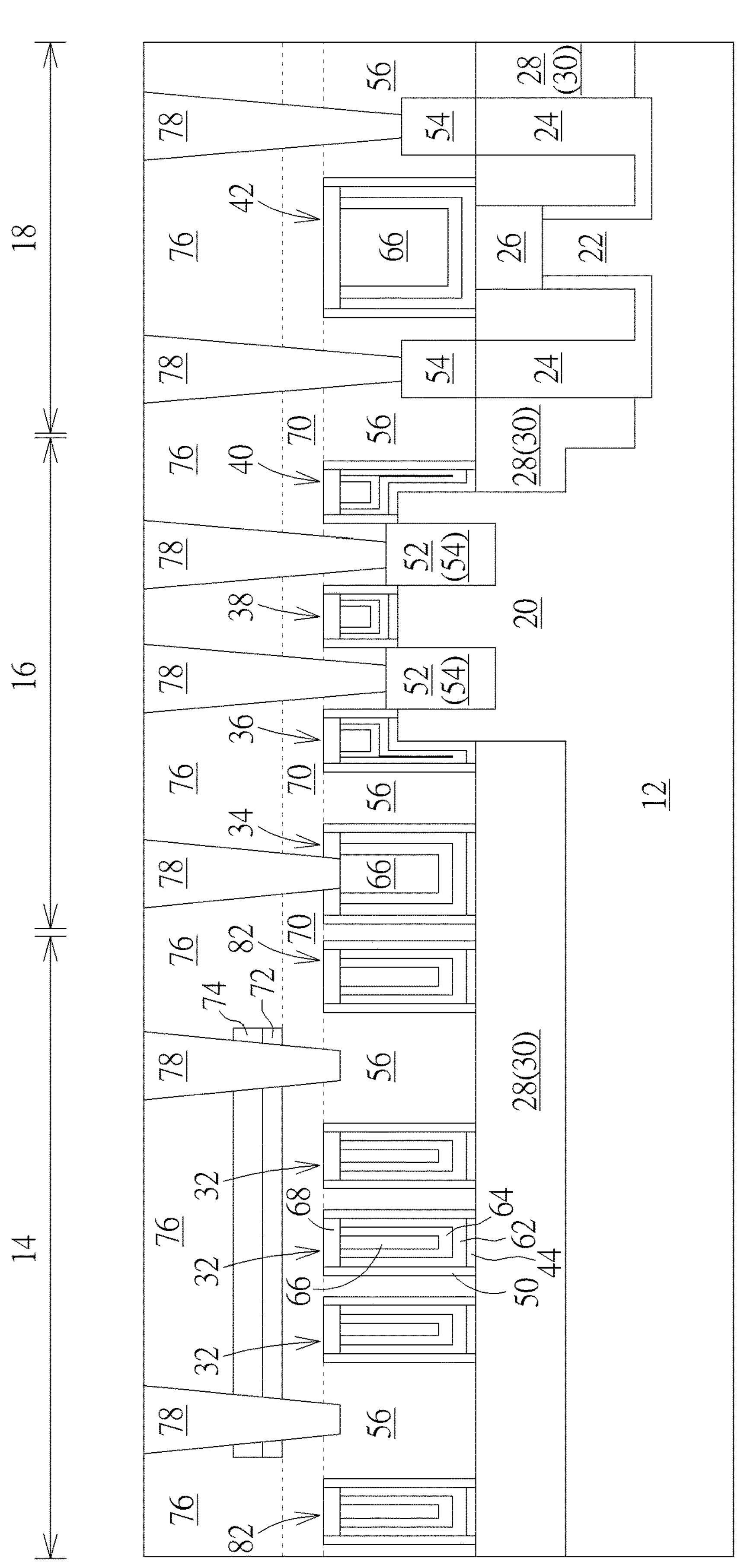
FIG. 8 illustrates a structural view of a semiconductor device according to an embodiment of the present invention.

Referring to FIG. 8, FIG. 8 further illustrates a structural view of a semiconductor device according to an embodiment of the present invention. As shown in FIG. 8, in contrast to only disposing a single gate structure 32 directly under the metal layer 72 in the embodiment shown in FIG. 6, it would also be desirable divide the gate structure 32 under the metal layer 72 in to multiple gate structures 32, in which the gate structures 32 directly under the metal layer 72 could have same or different widths and the top surface of the gate structures 32 is even with the top surface of the gate structures 34, 36, 38, 40, 42. It should be noted that even though no gate structure is disposed directly under the two contact plugs 78 penetrating through the metal layer 72 in this embodiment, two additional gate structures 82 could be formed adjacent to two sides of the contact plugs 78 on the resistor region 14 for improving overall uniformity of the entire region. Since the gate structure 82 and the gate structures 32, 34, 36, 38, 40, 42 are formed through the same process, the top surface of the gate structure 82 is even with the top surface of the gate structures 32, 34, 36, 38, 40, 42.

Figure 9:
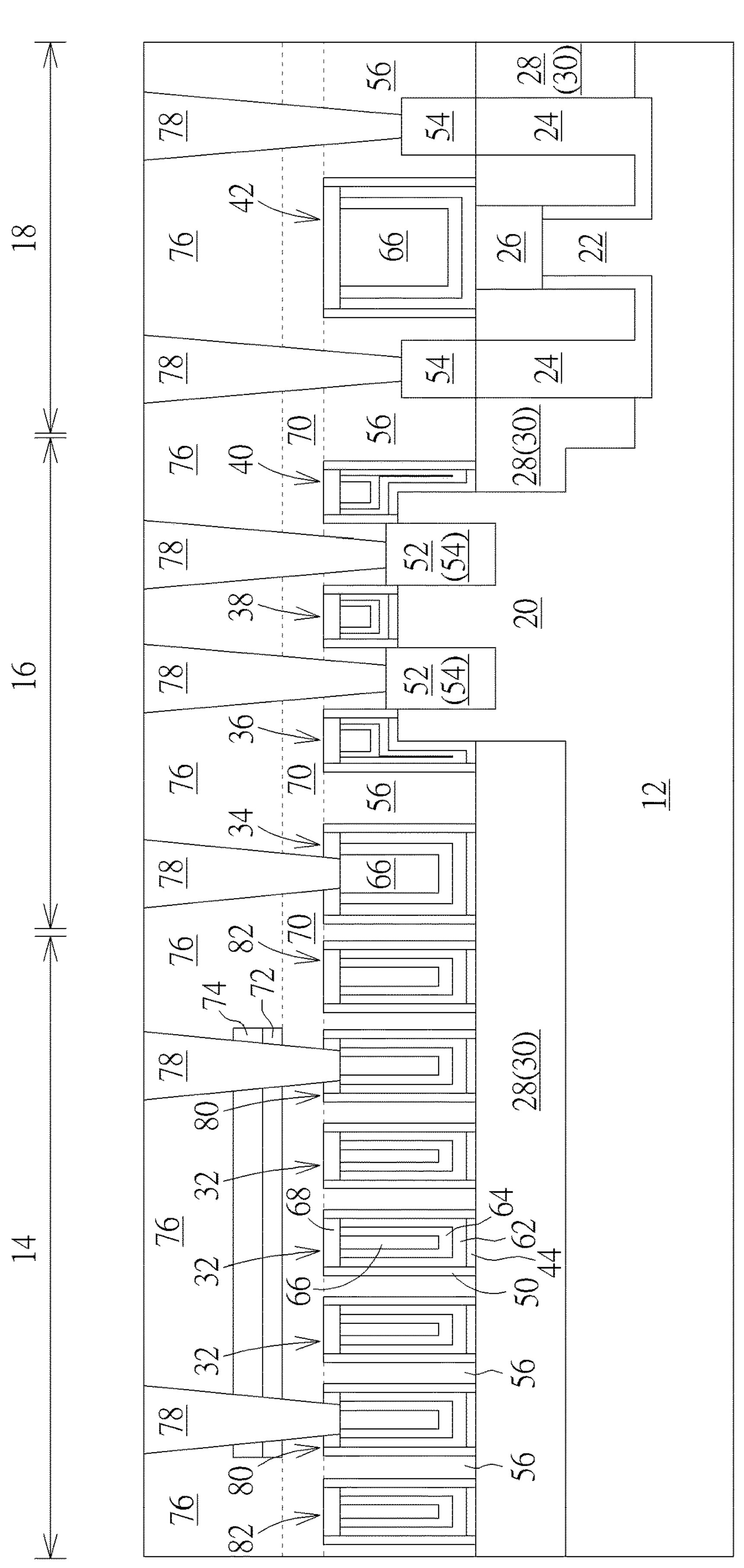
FIG. 9 illustrates a structural view of a semiconductor device according to an embodiment of the present invention.

Referring to FIG. 9, FIG. 9 further illustrates a structural view of a semiconductor device according to an embodiment of the present invention. As shown in FIG. 9, in addition to disposing a plurality of gate structures 32 directly under the metal layer 72 and gate structures 82 adjacent to two sides of the contact plugs 78 on the resistor region 14 as shown in FIG. 8, it would also be desirable to form gate structures 80 directly under and contacting the two contact plugs 78, which is also within the scope of the present invention.

Typically, in current integration of high resistance devices, LV devices, and HV devices, gate structures such as metal gates are often disposed on the substrate of LV region and HV region while no gate structures is disposed on the substrate directly under the resistor. In other words, current resistor is formed in a floating manner within an ILD layer as no gate structures or metal wires are disposed directly under the resistor except the ILD layer. Since the current design affects the uniformity of the region directly under the resistor, the present invention preferably forms one or multiple gate structures on the resistor region during the formation of the metal gates on the LV region and HV region. Preferably, each of the metal gates on the resistor region includes a hard mask, the top surface of the metal gate or metal gates on the resistor region is even with the top surface of the metal gates on the LV and HV regions, and the width of the metal gate on the resistor region is slightly less than the width metal layer 72 and cap layer 74 atop. By using this design, it would be desirable to improve the performance of the device due to insufficient density between metal gates.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for fabricating a semiconductor device, comprising:

providing a substrate having a resistor region;

forming a shallow trench isolation (STI) around the substrate on the resistor region;

forming a first gate structure directly on the STI on the resistor region;

forming a first interlayer dielectric (ILD) layer around the first gate structure;

transforming the first gate structure into a first metal gate, wherein the first metal gate comprises:

a gate electrode on the substrate; and a hard mask on the gate electrode;

forming a second ILD layer on the first metal gate;

forming a resistor on the first metal gate and the second ILD layer, wherein the resistor and the first metal gate are separated by the second ILD layer; and forming a first contact plug and a second contact plug adjacent to two sides of the first metal gate, wherein the first contact plug is a one-piece structure and penetrates the resistor and the second ILD layer, and a bottom surface of the first contact plug is lower than a top surface of the first metal gate.

2. The method of claim 1, wherein the substrate comprises a low-voltage (LV) region and high-voltage (HV) region, the method further comprising:

forming the first gate structure on the resistor region, a second gate structure on the LV region, and a third gate structure on the HV region;

forming the first ILD layer around the first gate structure, the second gate structure, and the third gate structure;

transforming the first gate structure, the second gate structure, and the third gate structure into the first metal gate, a second metal gate, and a third metal gate; and forming the second ILD layer on the first metal gate, the second metal gate, and the third metal gate.

3. The method of claim 2, wherein the top surface of the first gate structure and a top surface of the second gate structure are coplanar.

4. The method of claim 2, wherein the top surface of the first gate structure and a top surface of the third gate structure are coplanar.

5. The method of claim 2, wherein forming the resistor comprises:

forming a metal layer on the second ILD layer; and forming a cap layer on the metal layer.

6. The method of claim 5, wherein a sidewall of the metal layer is aligned with a sidewall of the cap layer.

7. The method of claim 5, wherein the metal layer comprises titanium nitride (TiN).

8. The method of claim 1, wherein the first metal gate is between the first contact plug and the second contact plug.

9. The method of claim 1, wherein a width of the first metal gate is less than a width of the resistor.

10. A semiconductor device, comprising:

a substrate having a resistor region;

a shallow trench isolation (STI) around the substrate on the resistor region;

a first gate structure directly on the STI on the resistor region, wherein the first gate structure comprises:

a gate electrode on the substrate; and a hard mask on the gate electrode;

a first interlayer dielectric (ILD) layer around the first gate structure;

a second ILD layer on the first gate structure;

a resistor directly on the first gate structure and the second ILD layer, wherein the resistor and the first gate structure are separated by the second ILD layer; and a first contact plug and a second contact plug adjacent to two sides of the gate structure, wherein the first contact plug is a one-piece structure and penetrates the resistor and the second ILD layer, and a bottom surface of the first contact plug is lower than a top surface of the first gate structure.

11. The semiconductor device of claim 10, wherein the substrate comprises a low-voltage (LV) region and high-voltage (HV) region, the semiconductor device further comprising:

the first gate structure on the resistor region, a second gate structure on the LV region, and a third gate structure on the HV region;

the first ILD layer around the first gate structure, the second gate structure, and the third gate structure; and the second ILD layer on the first gate structure, the second gate structure, and the third gate structure.

12. The semiconductor device of claim 11, wherein the top surface of the first gate structure and a top surface of the second gate structure are coplanar.

13. The semiconductor device of claim 11, wherein the top surface of the first gate structure and a top surface of the third gate structure are coplanar.

14. The semiconductor device of claim 11, wherein the resistor comprises:

a metal layer on the second ILD layer; and a cap layer on the metal layer.

15. The semiconductor device of claim 14, wherein a sidewall of the metal layer is aligned with a sidewall of the cap layer.

16. The semiconductor device of claim 14, wherein the metal layer comprises titanium nitride (TiN).

17. The semiconductor device of claim 10, wherein the first gate structure is between the first contact plug and the second contact plug.

18. The semiconductor device of claim 10, wherein a width of the first gate structure is less than a width of the resistor.

* * * * *